United States Patent [19]

Milberger et al.

[11] Patent Number: 5,162,965

[45] Date of Patent: Nov. 10, 1992

[54] ANTI CROW BAR CURRENT INTERRUPTER FOR MICROWAVE TUBE TRANSMITTERS

[75] Inventors: Walter E. Milberger, Panama City, Fla.; Franklin B. Jones, Catonsville; Charles S. Kerfoot, Pasadena, both of Md.

[73] Assignee: The United States of America as represented by the Secretary of the Air Force, Washington, D.C.

[21] Appl. No.: 722,820

[22] Filed: Jun. 28, 1991

[51] Int. Cl.$^5$ ............................................. H02H 3/08
[52] U.S. Cl. ...................................... 361/56; 361/57; 361/87; 361/93
[58] Field of Search .................. 361/56, 2, 78, 93, 88, 361/225, 57, 87; 323/265, 270, 350

[56] References Cited

U.S. PATENT DOCUMENTS

| 3,737,713 | 6/1973 | Kalish | 323/16 |
| 3,980,929 | 9/1976 | Bresnick | 361/225 |
| 4,618,837 | 10/1986 | Matsuura | 323/270 |
| 4,648,015 | 3/1987 | Davis et al. | 361/54 |
| 4,687,970 | 8/1987 | Musslyn et al. | 315/106 |
| 4,893,070 | 1/1990 | Milberger et al. | 323/270 |
| 4,897,617 | 1/1990 | Milberger et al. | 330/277 |

Primary Examiner—Howard L. Williams
Assistant Examiner—S. Jackson
Attorney, Agent, or Firm—Bernard E. Franz; Donald J. Singer

[57] ABSTRACT

A high-speed high-voltage FET current interrupter which opens the cathode circuit of microwave tubes when internal tube arcing occurs. By removing the detrimental fault current which causes degradation to the microwave tube body and grid, the longevity of the microwave tube and the pulse energy storage capacitor is greatly increased over those transmitters which use dissipative crow bar circuits. Even more important is that the transmitter reset time after an arc occurs is orders of magnitude faster than transmitters using crow bars or primary power interrupters when arcing occurs—an important feature when engaged in a "dog fight".

10 Claims, 5 Drawing Sheets

ANTI CROW BAR CURRENT INTERRUPTER FOR MICROWAVE TUBE TRANSMITTERS

RIGHTS OF THE GOVERNMENT

The invention described herein may be manufactured and used by or for the Government of the United States for all governmental purposes without the payment of any royalty.

BACKGROUND OF THE INVENTION

The present invention relates generally to the field of safety and protection of systems and devices by arc suppression using a solid state switch, and more particularly to a current interrupter for microwave tube transmitters which opens the cathode circuit in the event of tube arcing, using a current sensitive control circuit. It is an improvement over the load shunting crow bar spark gap method used to discharge the stored charge in the transmitter power supply, and is in fact an anti crow bar current interrupter.

United States patents of interest include U.S. Pat. No. 3,737,713, to Kalish, which teaches a regulated power supply across the anode and cathode of a TWT. U.S. Pat. No. 4,618,837 to Matsuura teaches a current limiting MOSFET transistor and reference voltage generator in the high-voltage path of an oscillator. U.S. Pat. No. 4,648,015 to Davis et al teaches a crow-bar circuit used to short to ground the overload current flowing in a microprocessor. U.S. Pat. No. 4,687,970 to Musslyn et al teaches a cathode current control circuit, a pulse level control amplifier and a cathode current transformer in series with a TWT amplifier. U.S. Pat. Nos. 4,893,070 and 4,897,617 to Milberger et al show a Milberger Connection in a Domino Effect Shunt Voltage Regulator and a Domino Effect Amplifier.

SUMMARY OF THE INVENTION

An objective of the invention is to provide a circuit to extend the longevity and reliability of transmitters by limiting the fault current through the pulse storage capacitor and the energy level discharged into the TWT by orders of magnitude.

This invention relates to a high-speed high-voltage field effect transistor (FET) current interrupter which opens the cathode circuit of a microwave tube in the event of tube arcing. The invention is an improvement over the crow bar spark gap method used to discharge the stored charge in the transmitter power supply. The crow bar spark gap discharge method presents a danger of degradation of transmitter elements. The present invention employs FETs which are capable of high-voltage switching at elevated voltages. The invention in a first embodiment employs a FET switch in series with the cathode of a traveling wave tube (TWT) and the high-voltage supply. When arcing occurs in the TWT, a coil of the fault current detector circuit detects the current increase and opens the FET switch. Another embodiment of the invention comprises an On-Off trigger FET gate control switch which controls a multi-core transformer connected to a plurality of bootstrap FETs in the cathode circuit of the TWT.

FEATURES OF THE INVENTION

Features of this invention which are considered novel and/or advance the state of the art in microwave tube transmitter technology are:

(1) A current interrupter which opens the cathode circuit of microwave tubes to increase the reliability and longevity of transmitters.

(2) A fault current interrupter that can be reset in less than one millisecond to reduce transmitter down time by orders of magnitude over transmitters that use crow bar or prime power interrupters (minutes) for microwave tube protection.

(3) A high-speed high-voltage FET switch comprised of either N- or P-channel transistors.

(4) An anti crow bar current interrupter which opens the cathode circuit of microwave transmitter tubes when internal tube arcing occurs.

(5) An On-Off trigger FET gate control switch employing separate On and Off trigger lines that uses a multi-core transformer whose common primary is contained in quartz glass tubing that has a dielectric strength of 20,000 volts per mil. Wherein the FET gate On and Off triggers supplying series connected FETs are disseminated from single turn secondaries of stacked ferrite toroidal cores that are separated to provide 2 Kv of creepage distance.

(6) A positive On trigger diode gate FET input that box cars the input capacitance of switching transistors; wherein, the on state may be sustained by applying refresh on triggers.

(7) A zener coupled negative Off trigger transformer circuit to discharge the gate to source capacitance of series connected FETs; wherein the Off state can be maintained by supplying refresh off triggers.

(8) A push pull high-voltage transformer driven by ground deck trigger amplifiers to provide both on and off FET gate commands through a single quartz glass enclosed primary winding supplying ferrite cores that are separated for a creepage distance of 2 Kv; wherein, series connected FETs are driven by a single secondary turn to supply a positive On trigger and a negative Off trigger to the FET gate through a 12 volt zener.

(9) An FET switch whose on impedance is equal to the combined series resistance of all the transistors stacked.

(10) A d-c positive biased FET switch whose dynamic impedance is equal to the number of series devices used times the reciprocal of the transconductance of the common FET used in the switching stack. When combined with zener coupled refreshed off triggers, the switch provides a modest On switching time with a very fast Off time.

(11) The Milberger Switch Connection which is inner laced to provide a bootstrap switch which is independent of all auxiliary bias and control circuits for its operation. The normally On switch is automatically latched off when faults occur. The switch on dynamic impedance is equal to the number of series stages times 1/Gm of the common transistors used in the stack. Wherein the voltage drop across the switch is equal to $(Vg+2Vg+3Vg+\ldots nVg)$. Both the On and Off switching times of the switch are modest.

(12) A d-c overload sensor circuit which causes the Milberger switch to open when fault currents occur. The circuit consists of a current sense resistor, an NPN and a PNP bi-polar transistor which causes the switch to become a constant current source prior to latch up that causes the switch to open. The switch can be reset by optical or transformer coupling means.

(13) A latch-up switch that may be operated by auxiliary commands, such as TWT loss of bias, to open the cathode circuit of the TWT.

(14) A low dynamic impedance wide band switch that may be used to interrupt the body supply and/or the collector supplies of microwave tubes without degrading the quality of the regulated body voltage.

(15) A means of switching the level of TWT body and/or collector supply voltages to optimize the performance of dual mode transmitters.

(16) A high-voltage FET switch to provide controlled switching of multiple tube microwave transmitters for power management.

(17) A means of removing a faulty microwave tube to permit graceful degradation in multiple tube transmitters.

(18) A means of removing detrimental fault currents from microwave tubes without discharging the pulse energy storage capacitor or changing the state of the body power supply. This is an important attribute since failures of low-level circuits and power supply components will not occur as a result of high currents in high-voltage transients.

DETAILED DESCRIPTION

INTRODUCTION

A high-speed high-voltage current interrupter is placed in series with the body and/or collector supplies of microwave transmitter tubes to disconnect the supplies from the tube when fault currents resulting from internal tube arcing occur. The FET switch used is capable of interrupting currents up to 50 amperes at voltages up to 50,000 volts with a rise time faster than 100 volts per nanosecond. This technique is a substantial improvement over protection methods that use crow bar spark gaps to discharge the stored charge in the transmitter power supplies. Energy dumping by a crow bar allows high energy level (>>35 joules) and high current (>>50 amperes) to be discharged directly into the microwave tube elements, which causes degradation of both the microwave tube and the energy storage capacitor. Firing of high energy crow bars invariably generates large high-voltage transients throughout the transmitter system. These transients often cause degradation or failure of power supply components and low-level control circuits.

The new method extends the longevity and reliability of transmitters by limiting the fault current through the pulse storage capacitor and the energy level discharged into the TWT by orders of magnitude. Since the high-speed switch interrupts the fault immediately, ion generation within the tube is limited. Furthermore, the switch can be reset within a millisecond as opposed to the minutes required for transmitters that use crow bars and primary interrupts. This is an extremely important feature when the radar is employed in a tactical situation.

Independent protection and switching of two or more parallel transmitter tubes is now possible. This feature can be used for power management and allows for graceful degradation when one tube fails. The high-voltage high-speed switching circuit can also be used to switch TWT body and/or collector voltages during the inter pulse periods of dual mode transmitters to optimize their performance. The switch may also be used for slow turn on of the transmitter high-voltage power supplies or any other function that requires fast switching at an elevated potential. PREVIOUS METHOD:

Transmitter microwave tubes, such as traveling wave tubes (TWT), use extremely high voltages (10 to 100 kv) to form their electron beam. Since both the cathode and grid of the tube are elevated at this high potential, they often arc over to the grounded body. Tube arcs can occur when ions migrate in a high potential gradient situated between tube elements. New tubes often arc as a result of fingers that are formed from manufacturing residue. Whatever the cause, internal tube arcs generate ions which must be extracted by an ion pump to maintain the tube integrity. Repeated arcing will eventually make the tube inoperative. For this reason, it is necessary to limit the fault current.

In pulsed radar systems the most detrimental energy source is the pulse energy storage capacitor necessary to prevent voltage droop on the cathode of the microwave tube. For microwave tubes that can dissipate a modest amount of energy in their control elements, it is only necessary to place a current limiting resistor in series with the tube cathode to absorb this energy. This arrangement causes most of the fault energy to be dissipated external to the tube when arcing occurs. When the supply energy source (storage capacitor) far exceeds the energy the microwave tube elements can dissipate, it is necessary to divert the energy. This is normally done by dumping the storage capacitor by means of a crow bar. Even after the pulse energy storage capacitor is discharged, the tube arc can be sustained by power follow through from a high-voltage power supply, so it is necessary to remove the prime power source to quench the arc.

CROW BAR OPERATION

Figure 1:
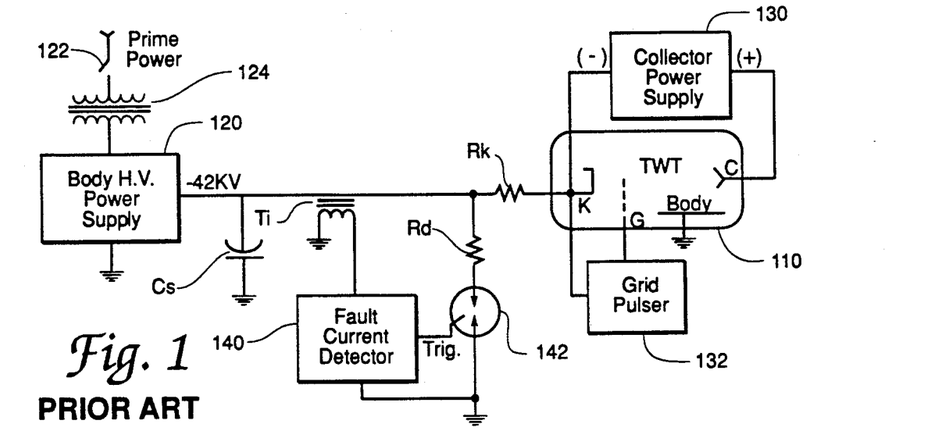
FIG. 1 is a block and schematic diagram of a typical prior art crow bar circuit.

FIG. 1 shows a block diagram of a transmitter which uses a crow bar to protect a TWT against excessive dissipation when tube arcs occur. The TWT 110 has cathode power supplied from a body high-voltage power supply 120 at −42 kilovolts, via a 100 ohm cathode resistor Rk. A 2.5 μf storage capacitor Cs is connected from the output of the power supply 120 to ground. Prime power is supplied to the supply via a switch 122 and a transformer 124. A collector power supply 130 is connected between the cathode and collector elements of the TWT. A grid pulser 132 is connected between the cathode and the grid.

In the arrangement shown, the peak body current supplied by the TWT cathode, is monitored by current transformer Ti. When TWT arcs occur, the fault current detected by the transformer is fed to an overload detector 140 which supplies a trigger to the spark gap 142 when threshold of 2 to 4 times the normal peak current is exceeded. This action causes the spark gap 142 to fire and discharge storage capacitor Cs through resistor Rd. Limiting resistor Rd limits the current through the spark gap and the storage capacitor while dissipating the stored energy. The time it takes to complete the cycle is equal to the transport delay from transformer Ti to the time the spark gap fires plus the time it takes to discharge the storage capacitor to the de-ionization potential of the spark gap.

The electrode of the TWT and cathode resistor Rk must dissipate the discharge energy prior to the time the spark gap fires. After the gap fires, the dissipation is split between resistors Rd and Rk until such time either the gap or the tube arc is quenched. The gap can continue to conduct until the body power is disconnected. When a choke input power supply filter is used, it may not be necessary to disconnect the supply since the choke may provide isolation until the gap drops out.

SECONDARY EFFECTS

When the grid of the TWT arcs to ground a positive going transient equal in magnitude to the body voltage appears across the floating deck grid pulser 132. The duration of the transient is equal to the crow bar firing cycle. If the pulser is not adequately protected, it may be damaged. The longer it takes for the TWT cathode voltage to be removed, the greater is the chance of damage to floating deck components.

The high level of radiation and high current conduction in the ground plane when the spark gap fires is often detrimental to low-level logic and linear devices associated with the transmitter processing and control circuits. Appropriate protection of these devices is therefore necessary.

CIRCUIT DESIGN PARAMETERS

To describe the operation of the TWT crow bar protection circuit, component values used in an ongoing Westinghouse transmitter design are used to quantify the electrical parameters and specifications. For the purpose of calculation, the electrical values assigned to the functions and components in FIG. 1 are used.

The charge on storage capacitor Cs (2.5 $\mu$f) is: $C \times V \times V/2$ is 2,200 joules for the $-42$ kv body supply. This energy is equivalent to that necessary for a 150 pound man to jump ten feet straight up into the air. In any case, all of the energy in the storage capacitor must be absorbed by the 10 ohm crow bar resistor Rd each time the transmitter crow bar fires. The resistor must have mechanical strength to absorb the kinetic energy as it is converted into heat. This requirement makes the resistor large and bulky.

A delay of 2 $\mu$sec is encountered from the time a TWT arc occurs to the time the spark gap fires. During this interval, the TWT arc and the 100 ohm cathode resistor Rk must absorb the energy disseminating from the storage capacitor. In the case referenced, this amounts to about 35 joules.

PARALLEL TWT CONFIGURATION

Figure 2:
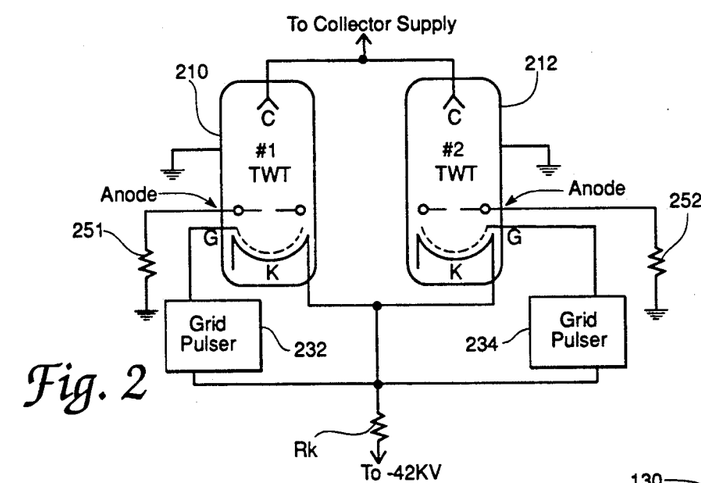
FIG. 2 is a block and schematic diagram showing parallel traveling wave tubes with isolation anodes.

The actual transmitter design, shown in FIG. 2, uses two TWTs 210 and 212 operated in parallel sharing a common floating deck but using separate pulsers. An anode is placed between the grid and body of each TWT to divert the arc path that would otherwise exist between the grid and direct ground. These anodes are returned to ground through 10,000 ohm resistors 251 and 252 to limit the arc current of either tube to 4.2 amperes until such time as the crow bar fires. In the event the crow bar fails to fire, the resistors could burn up and the arc could go directly to the body. It is also possible for the anode to arc to the body ground if the crow bar firing time is too slow. This again would complete the path from grid-cathode to ground. The only current limiting would be the common 100 ohm cathode resistor Rk. This infers that the protection circuit must be designed to provide TWT longevity as if no crow bar is used. If the tube elements are rugged enough, increasing the cathode resistors for both tubes would be one solution. The resistors must be high enough in value to limit the fault current to acceptable limits. Since the combined peak body current of the two TWTs is one ampere, a 1 or 2 K resistor would be a reasonable value. The resistor must then dissipate increased power. The 42 kv body supply output is raised to account for the one or two thousand volt drop across the cathode resistor. The prime power must be turned off to prevent sustained dissipation and to quench the arc.

NEW METHOD

Field effect transistors and innovative circuit design now make high-voltage switching at elevated voltages possible. Although some vacuum tubes might have suitable electrical characteristics to fulfill this application, they are not practical because of the filament and auxiliary supplies required. SCRs have acceptable turn-on characteristics but are too slow to turn off.

Figure 3:
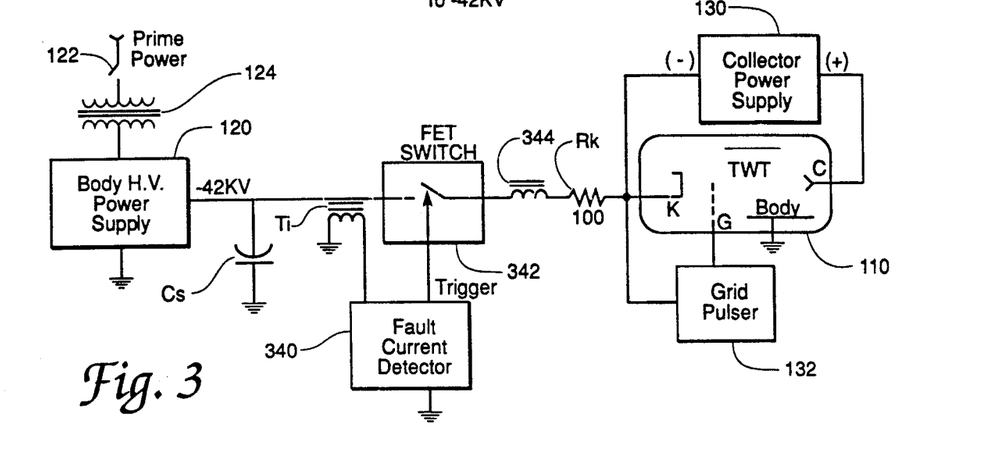
FIG. 3 is a block and schematic diagram of an anti crow bar circuit according to the invention.

FIG. 3 shows the new interrupter used to protect microwave transmitter tubes. The circuit is the same as that of FIG. 1, except that the spark gap 142 and its series resistor Rd is replaced by an FET switch 342 controlled by a fault current detector 340. Rather than dumping the storage capacitor Cs, the body supply circuit from the power supply 120 is opened when fault currents are detected. In essence, the circuit is an "Anti Crow Bar". When high-speed FET switches are used, only a small fraction of the stored energy in capacitor Cs will enter the microwave tube and virtually no radiation or high level ground currents will be generated during its operation. For a comparison between the crow bar and the anti crow bar circuits, the same examples as used for the crow bar circuits are used to characterize the FET interrupter switch operation.

FET switch design using 1,000 volts MTP1N100 transistors having a switching time of 100v/NSec. Thus far a voltage of 24,000 volts has been switched with one ampere resistive load. The hold-off voltage of the series of the anti crow bar circuit for the 42 Kv body supply discussed earlier is determined.

At 42 Kv the FET interrupter will switch a six ampere fault current in 400 nanoseconds. This includes 30 nanoseconds for fault detection and turn-on delays. When isolated anodes are used in the parallel TWT arrangement, the fault current is limited to 4.2 amperes, well within the limit of the switching transistor. For this current level, the transistor switch needs to dissipate only a few hundred millijoules of energy; whereas, the crow bar circuit must absorb 2,200 joules of energy.

Lacking the current limiting of the 10,000 ohm ground return resistors of the TWT isolated anodes, current limiting is provided for the turn-off period. To limit the current to 4.2 amperes at 42 Kv, a series 300 $\mu$h choke 344 must be added in FIG. 3. To circumvent the difficulties of designing a 42,000 volt choke, six 500T600 FERROXCUBE 3E2A toroid cores with three turns of high-voltage wire will provide the 300 microhenries required. This core material will also provide damping to prevent excessive overshoot at the end of the switching period. The series choke does not degrade the rise time of the transmitter since the body peak current is only one ampere. A rise time of 7 nanoseconds is possible with the series 300 $\mu$h choke. Another means of limiting the peak current through the FET switch is to use automatic current limiting in the switch itself. This can be done by using the "Milberger Switch Connection" which will be discussed later. The energy dissipated in either the interrupter switch or crow bar circuit does not depend on whether or not isolated anodes are used. During the delay time before the FET switch opens (30 nanoseconds), only a few hundred microjoules enter the FET rather than the 35 joules for the crow bar circuit which has a delay of two microseconds.

For many microwave tubes the 35 joules of fault energy is well within the limit of the allowable control grid dissipation. This is not true, however, for the microwave tube pulser. As was mentioned earlier, the entire fault current can flow directly through the TWT grid pulser when the grid to body arcs occur. See FIG. 1. If the pulser is not protected for this condition by means of solid state clamps and spark gaps, the pulser can be damaged. When the pulser becomes shorted the tube may conduct continually after the initial arc subsides. This condition will not be possible when the anti crow bar circuit is used since the arc energy is limited to a few hundred millijoules. This does not infer that protection of the pulser is no longer required. The anti crow bar circuit can also be used to turn off the TWT if the tube loses defocus grid bias. Loss of the negative bias can cause the TWT beam to defocus which may damage the RF structure.

ANTI CROW BAR INTERRUPTER OPERATION

Three high-voltage FET switch circuits have been developed for application as an Anti Crow Bar Interrupter. They are:

(1) On-Off trigger gate control switch which is normally off. The On state can be maintained by supplying refresh On triggers.

(2) A normally On switch which requires refresh Off triggers to maintain an Off state.

(3) The "Milberger Switch Connection" which is normally on. This switch provides automatic current limiting and is latched off when fault current is detected.

ON-OFF TRIGGER GATE CONTROL SWITCH

Figure 4:
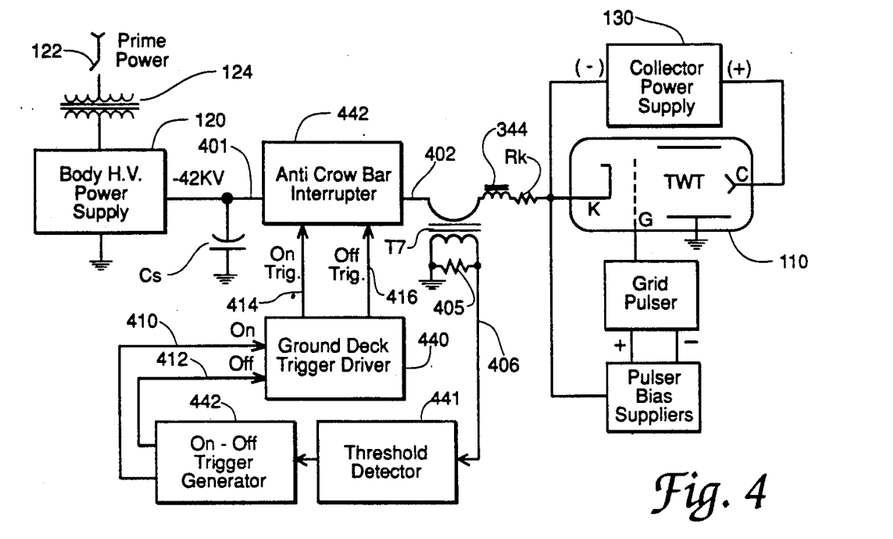
FIG. 4 is a block diagram of an anti crow bar circuit.
Figure 4A:
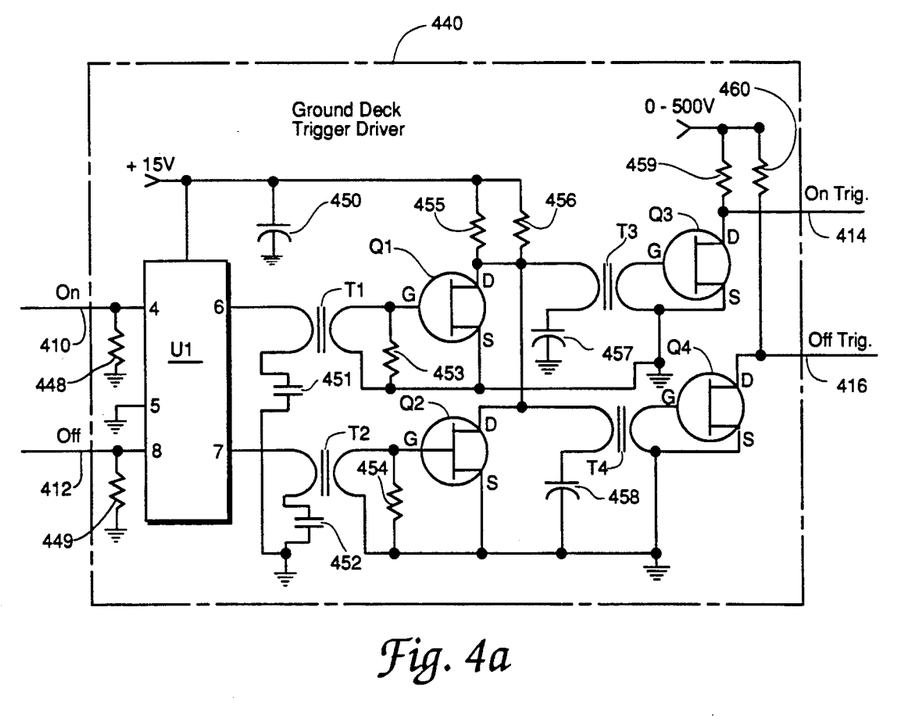
FIGS. 4a and 4b are schematic diagrams of the Ground Deck Trigger Driver and Anti Crow Bar Interrupter of FIG. 4.
Figure 4B:
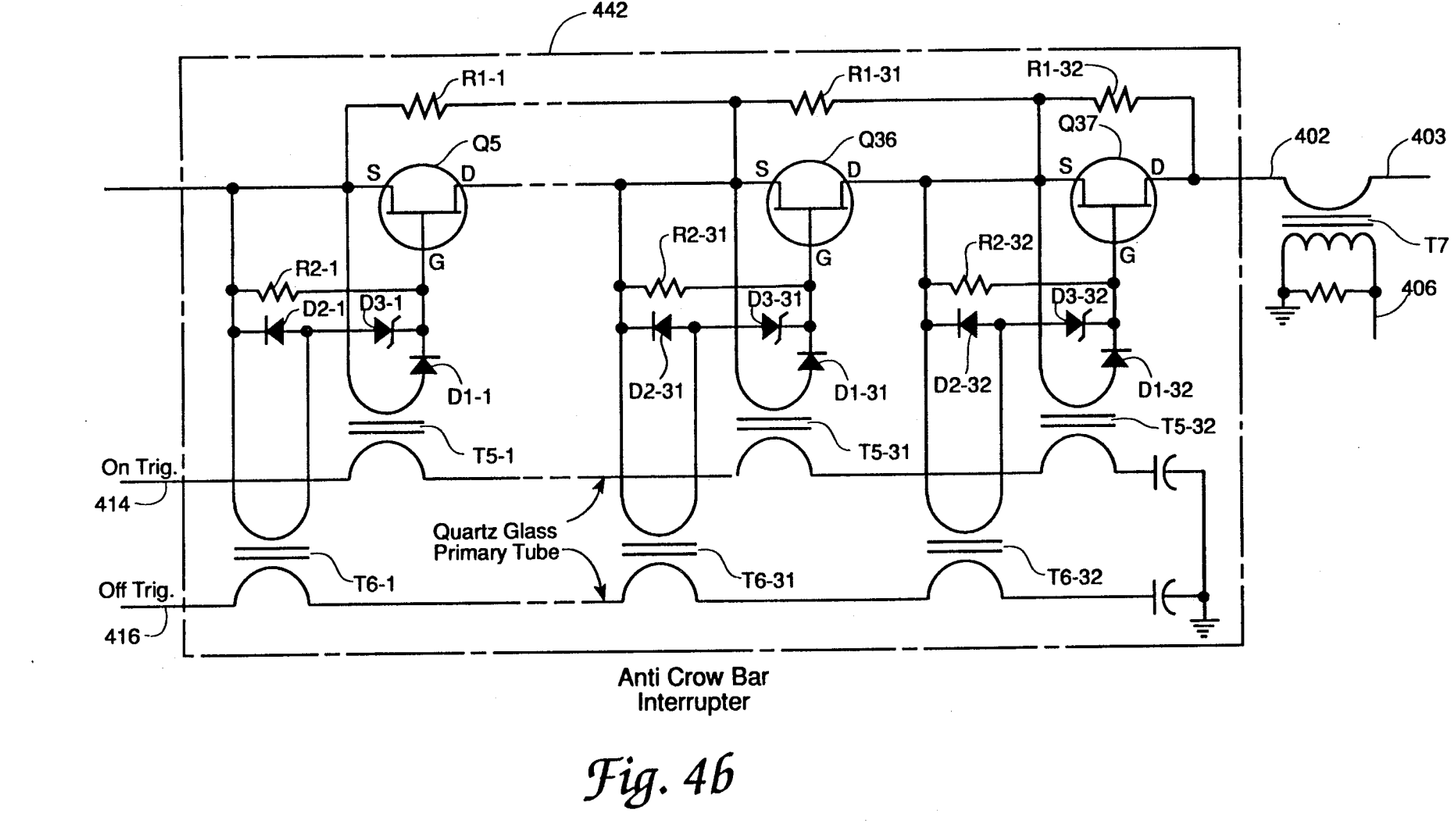

FIG. 4 shows the block diagram of the Anti Crow Bar Circuit which uses On/Off Triggers to control the state of the current interrupter, and schematic diagrams of a Ground Deck Trigger Driver and the Anti Crow Bar Interrupter are shown in FIGS. 4a and 4b respectively. In FIG. 4, the −42 KV power supply 120 with a storage capacitor Cs, and the TWT 110 with its collector and grid supplies, are the same as in FIGS. 1 and 3. The Anti Crow Bar Interrupter 442 is connected to the storage capacitor Cs and the power supply 120 via lead 401; and to the cathode of the TWT 110 via lead 402, the primary of a current sensing transformer T7, the 300 $\mu$h choke 344 and the current limiting resistor Rk. A 100 ohm resistor 405 is connected across the secondary winding of transformer T7, which has one end grounded and the other end connected via lead 406 to a Threshold Detector 441. The output of the Threshold Detector goes to an On-Off Trigger Generator 442, which supplies on and off signals via leads 410 and 412 to the Ground Deck Trigger Driver 440. The Output of the Ground Deck Trigger Driver 440 comprises an On trigger signal via lead 414 and an Off trigger signal via lead 416, which go to the Anti Crow Bar Interrupter 442.

As shown in FIG. 4a, the Ground Deck Trigger Driver 440 has the input leads 410 and 412 for On and Off signals connected to inputs 4 and 8 of an IC chip type DS0026. These input leads are shunted to ground via 100 ohm resistors 448 and 449 respectively. The chip U1 has terminal 5 grounded, and terminal 6 connected to +15 volts with a 4.1 $\mu$f capacitor 450 to ground. Output terminals 6 and 7 are connected to primary windings of transformers T1 and T2 respectively, the other ends of which are connected via capacitors 451 and 452 to ground. The secondary windings of transformers T1 and T2 are shunted by 100 ohm resistors 453 and 454 and connected to the gate and source of transistors Q1 and Q2 respectively. Transistors Q1 and Q2 may be FET type VN49AL or 2N6661. They have the drains connected via 200 ohm resistors 455 and 456 to +15 volts, and also via primary windings of transformers T3 and T4 in series with 4.1 $\mu$f capacitors 457 and 458 respectively to ground. The secondary windings of transformers T3 and T4 are connected to the gates and sources of type MTP1N100 FET transistors Q3 and Q4, with the sources grounded. The drains of transistors Q3 and Q4 are connected via 5100 ohm resistors 455 and 456 to a 0–500 volt supply, and also to the output leads 414 and 416 respectively. The transformers T1, T2, T3 and T4 have FERROXCUBE toroid cores.

The Anti Crow Bar Interrupter 442 as shown in FIG. 4b comprises thirty-two type MTP1N100 FET transistors Q5-Q37 in series, with the source of transistor Q5 connected to lead 401, the drain of each connected to the source of the next, and the drain of the transistor Q37 connected to lead 402. The source to drain of the transistors Q5-Q37 are shunted by one megohm resistors R1-1 to R1-32 respectively. The On and Off trigger lines 414 and 416 are coupled to the transistors Q5-Q37 via transformers T5 and T6, each of which has thirty two sections. The thirty-two sections of transformer T5 are designated T5-1 to T5-32 in FIG. 4b. Each section has a secondary winding coupled to the sources and gates of the respective transistors, each having a diode with its anode connected to the transformer winding and its cathode connected to the transistor gate, these diodes being designated D1-1 to D1-32. Each of the transistors Q5-Q37 has a one megohm resistor connected between its source and gate, these resistors being designated R2-1 to R2-32 in FIG. 4b. Transformer T6 also has thirty-two sections designated T6-1 to T6-32, with a diode across the secondary winding having its cathode connected to the source of the corresponding transistor, these diodes being designated D2-1 to D2-32. The anode of each of these diodes is connected to the anode of a Zener diode, which are designated D3-1 to D3-32, each of which has its cathode connected to the gate of the respective transistor. The transformers T5 and T6 are made using toroid cores, part number 266CT125, of 3E2A/ferrite material.

When no triggers are supplied to the Ground Deck Trigger Driver 440, the Anti Crow Bar Interrupter 442 is in the Off state. To close the interrupter it is necessary to program the on trigger input of clock driver U1 with continuous triggers. These triggers are amplified and shaped by transistor stages Q1 and Q3 to provide 500 volt triggers to the primary of transformer T5. The primary is a single wire that passes through thirty-two ferrite toriodal cores, each of which drives a single transistor switch. The number of cores can be reduced by using multiple secondaries on each core to control more than one switching transistor. The primary wire is isolated from the cores and the secondaries of transformer sections T5-1 to T5-32 by quartz glass tubing which has a dielectric strength of 20,000 volts per mil. Each core is separated to provide a creepage distance of two or more thousand volts from its adjacent member. Like the primary, the transformers secondary winding is a single turn. The secondary turn is inverted to supply positive On triggers to the gate hold-off diode of transistors Q5 through Q37 to maintain those transistors in an on state as long as refresh triggers are provided. This is the normal condition when the transmitter is operating. In this condition the body peak pulse current from storage capacitor Cs is supplied to the cathode of the TWT 110 through the interrupter switch 442.

If fault current (2-4 times normal) is detected by current transformer T7, the output of the threshold detector will inhibit the On trigger generator 442 at the same time an Off trigger is supplied to the input of clock driver U1. This action causes a 500 volt Off trigger to be generated across the primary of transformer T6. Similar to the On trigger transformer T5, the single turn secondaries of transformer sections T6-1 through T6-32 provide turn-off triggers to transistors Q5 through Q37. This action interrupts the fault current by opening the cathode circuit of the TWT. The switch remains open until the threshold detector is reset. The detector can be designed to latch off and/or operate in a monostable mode.

Figure 5:
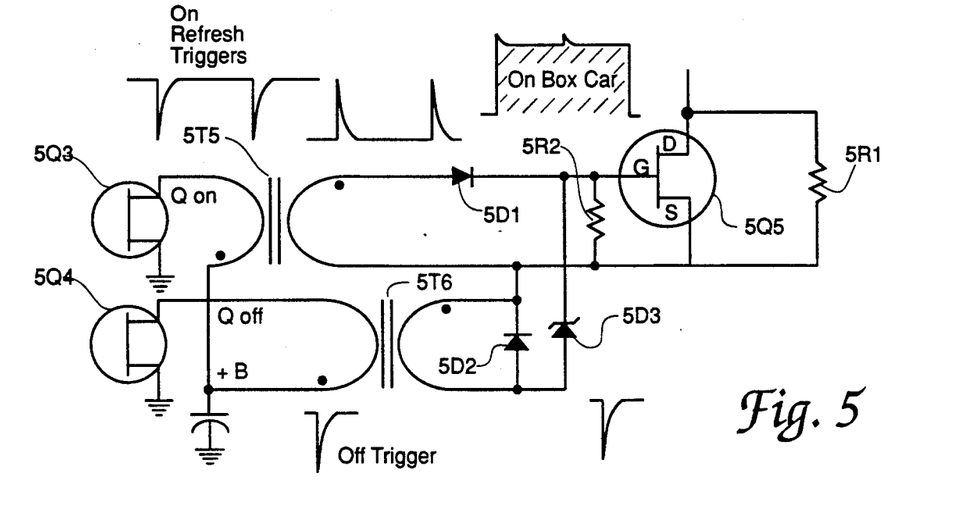
FIG. 5 is a schematic diagram of a trigger switch, with graphs of the signal at various points in the circuit.

FIG. 5 is used to illustrate the operation of the FET switch used in the series string (Q5-Q37) comprising the high-voltage interrupter. Separate On-Off trigger transformers 5T5 and 5T6 are used, driven by transistors 5Q1 and 5Q2 respectively. Transformer 5T6 has a diode 5D2 across its secondary winding, with its cathode connected to the source of transistor 5Q5. The On triggers are 50 nanoseconds wide and 15 to 20 volts high. Transformer 5T5 inverts the On trigger to provide positive triggers to hold-off diode 5D1 which passes pulse current to charge the gate to source capacitance of the FET 5Q5 up to 12 volts which is limited by the clamp action of zener diode 5D3. At +12 volts, the FET is hard on and appears as a resistor equal to the FETs Rs. Refresh on triggers must be supplied to account for the gate voltage decay set by the RC time constant of the gate to source capacitance and the 1M ohm gate resistor 5R2. For a 1,000 picofarad gate to source capacitance the time constant is one millisecond. This requires that refresh triggers must be supplied at a rate of 10 Khz to maintain the FET in the hard On state. The transistor is turned off by removing the on triggers and applying an off trigger through transformer 5T6. Since the gate of the transistor is charged to 8-12 volts, the negative trigger applied to the anode of the 12 volt zener 5D3 rapidly discharges (10-20 Nsec) the input capacitance below the gate threshold voltage (+3 v) to turn the FET 5Q5 off. To insure that the transistor remains off, it is necessary to select the value of the gate resistor 5R2 (1M ohm) low enough to account for the drain to gate leakage current of the FET. In the Off state the transistor looks like the 1M ohm drain to source voltage divider resistor 5R1 used to assure equal voltage sharing of all series FETs.

Figure 6:
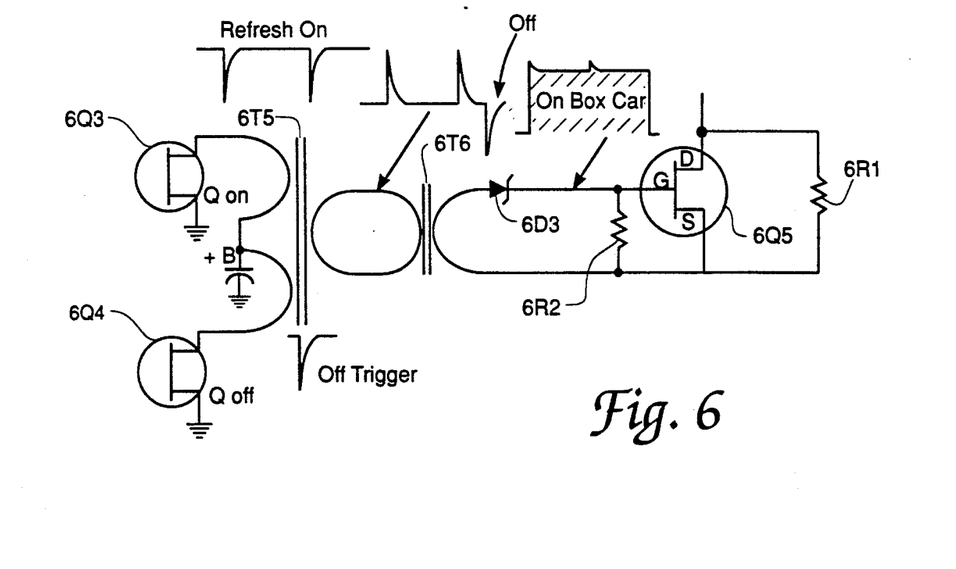
FIG. 6 is a schematic diagram of a two line On-Off trigger switch, with graphs of the signal at various points in the circuit.

Another version of the On-Off trigger controlled FET switch is depicted in FIG. 6. The performance of this switch is the same as that shown in FIG. 5 except that only one high-voltage transformer is required to provide the on and off switch operation. This is done by operating the output of the ground deck trigger generator transistors 6Q3 and 6Q4 in push pull in the primary of transformer 6T5. The combined output is then used to drive the primary of high-voltage transformer 6T6 that provides on-off trigger drive to all of the series FET switches. The operation is the same as the separate transformer version, except that diode 6D3 is a 12 volt zener which provides both the hold-off diode and zener functions. The disadvantage of this circuit is that leakage inductance of the transformers causes voltage back swing which makes trigger separation difficult.

REFRESH OFF TRIGGER NORMALLY ON SWITCH

Figure 7:
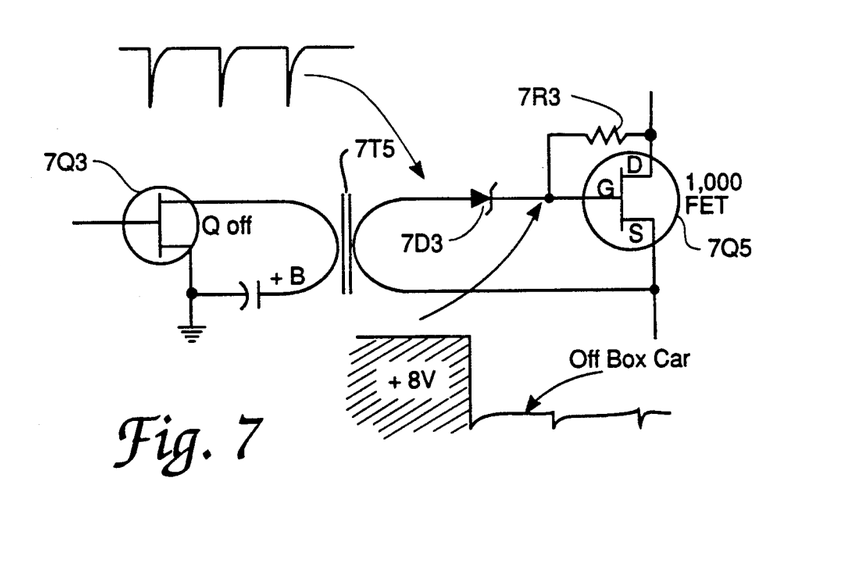
FIG. 7 is a schematic diagram of a refresh Off trigger normally On switch, with graphs of the signal at various points in the circuit.

FIG. 7 shows a d-c bias on and trigger off FET switch configuration in which the transistor uses a resistor 7R3 to maintain the switch in an on condition. In the steady state condition the drain voltage would be equal to the gate voltage set by zener 7D3. Rather than looking like a switch the transistor is a unity gain operational amplifier whose reference is the zener voltage. The output impedance is equal to the reciprocal of the transistor transconductance, which is very low over a wide bandwidth. If an eight volt zener is used in each stage, the voltage drop across a 32 stage interrupter would be 256 volts. For MTP1N100 transistors the switch hold-off voltage would be 25,000 volts for a 20% derating. This places the drain of each stage 800 volts above its source voltage. At this voltage it takes 100 $\mu$sec to charge the gate up to the eight volt zener level when a 10M ohm drain to gate bias resistor 7R3 is used. Refresh triggers must be supplied at a 100 Khz rate to keep the gate of the FET well below its three volt threshold voltage level. The advantage of the circuit is that only off triggers and one high-voltage transformer are required. The disadvantage is that the voltage drop across the interrupter will be higher than the straight switch mode for a given pass current.

THE MILBERGER SWITCH CONNECTION

The Milberger Connection is entirely d-c operated. The circuit is self contained and does not require a current transformer, control triggers, or auxiliary circuits to detect and execute switch turn off when fault currents occur. The Milberger Connection is described in U.S. Pat. Nos. 4,893,070 and 4,897,617 to Milberger et al. In the arrangement shown in FIG. 8, the connection comprises a series chain of type MTP1N100 FET transistors 8Q1, 8Q2, 8Q3, etc., each having a one megohm resistor connected between the gate and drain, and a one megohm resistor connected from the gate of each to the source of the preceeding one. The source of the first stage 8Q1 is connected via a 0.25 ohm current sensing resistor to the body storage capacitor Cs. The drain of the last stage is connected to the cathode of the TWT 110. Input to the first stage comprises a type 2N2905 transistor Qa and two type 2N2222 transistors Qb and Qc, with the emitter of transistor Qc connected to the gate of the FET transistor 8Q1. The junction of the resistor Ri and the source of FET 8Q1 is connected via a type 1N4148 diode to the collector of transistor Qc, and also to the base of transistor Qb. The junction of resistor Ri and the storage capacitor is connected to the emitter of transistor Qc, and also via a 470 kilohm resistor to the collector of transistor Qa. A Reset input lead is connected to the base of transistor Qc. An Auxiliary input is connected via a 1N4148 diode to the base of transistor Qb, the collector of transistor Qc, and via a 10 kilohm resistor to ground.

Figure 8:
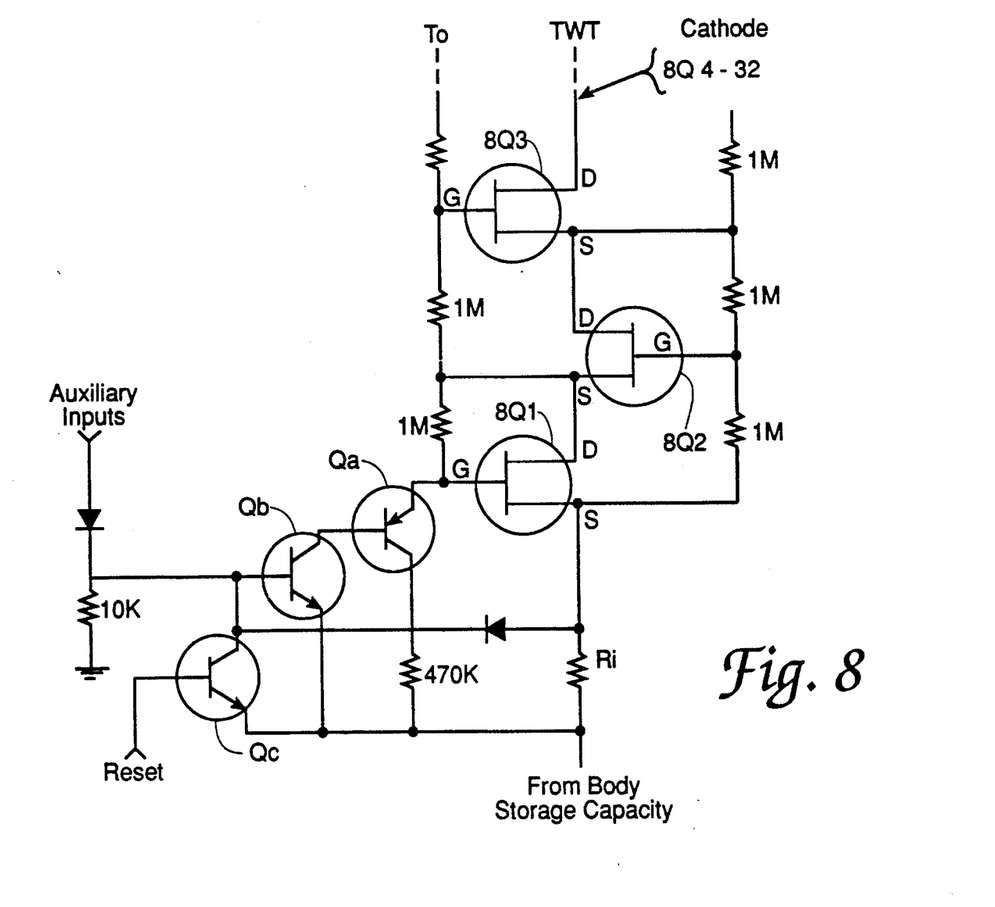
FIG. 8 is a schematic diagram of an anti crow bar interrupter using a Milberger Switch Connection.

Quiescently all FETs in the switch chain of FIG. 8 are biased on by virtue of the 1 Megohm resistor between the drain and gate of each stage. All stages operate as unity gain amplifiers, only their reference voltages differ. The drain voltage of the bottom stage 8Q1 appears at its gate threshold voltage of three volts. The next higher level stage has a source reference equal to drain voltage of stage 8Q1 plus its own gate 3 volt threshold voltage. When the feedback and gate reference resistors are the same value (unity gain), the drain of transistor 8Q2 will be six volts above its source. Since the next higher level stage 8Q3 references the source of 8Q2, its output will be equal to the 6 volt drain voltage of Q2 plus its own three volt gate threshold voltage or 9 volts above its source. Thus the drop incurred for the first three stages will be 3+6+9 or 18 volts. This series progression continues for all ascending stages. For 32 stages the drop would be 1,636 volts rather than the 256 volt drop given in the previous example. Since the Milberger Connection can be used for bi-polar transistors as well as FETs, the 1,636 volt drop can be reduced to about 500 volts by employing bi-polar transistors. When operated at low current levels the high-voltage drop may not be important compared to the advantages afforded.

When the fault current level causes the voltage drop across sense resistor Ri to approach one volt, transistor Qb turns on. This action causes transistor Qa to conduct which develops a positive going voltage at its collector. This voltage is fed back to the base transistor Qb. This causes transistor Qb to conduct harder which drives transistor Qa harder. This regenerative action continues until the a latch up condition is sustained. When the drop across transistor Qa drops below the gate threshold voltage of switch stage 8Q1, stage 8Q1 turns off causing its drain to go positive. This action causes the next higher level stage to turn off which in turn causes the next higher level stage to turn off. This action propagates through the whole switch chain until all devices are turned off. The propagation time is equal to the square root of the number of stages used times the reciprocal of the Ft of the FET. For the MPT1N100 transistor, the turn-off time is in the order of 200 to 500 nanoseconds.

To reset the anti crow bar interrupter, a positive voltage is applied to the base of transistor Qc. This may be done by transformer coupling or by fiber optics. Auxiliary inputs. such as loss of TWT grid bias, can be used to open the TWT cathode to expand the utilization of the high-voltage interrupter.

SWITCH CIRCUIT SALIENT FEATURES

Each switch circuit described above is unique. All of the circuits can be configured as either a N-channel or P-channel switch. The N-channel FET is generally available in higher voltage devices.

Both the single and two line FET gate control switches which use On and Off triggers have fast turn on and turn off times. In the On state, the voltage drop across these switches is equal to the composition series resistance of all the transistors times the current flowing through them.

The switch which uses d-c bias and refresh off triggers has a slower turn-on speed with a turn-off speed comparable to the On-Off trigger switches. The voltage drop across the switch in the on state is equal to the summation of all the gate threshold voltages of the series FET string. The dynamic output impedance is equal to the reciprocal of the common FET used times the number of stages. Unlike the refresh On trigger switch whose on voltage is contingent upon the current flowing through the switch, the voltage drop across the d-c on bias switch is constant independent of current flow. The only voltage variation is caused by the shift in FET gate threshold voltage over temperature.

The Milberger Switch Connection which uses both d-c on and off bias control has modest on and off switching speeds. Its output impedance is equal to the summation of the number of stages times the 1/Gm of the common stage used. The voltage drop across the switch is equal to the series progression (Vg+2Vg+... nVg): where: Vg is the gate threshold voltage of the common FET used and "n" is the number of stages. This switch configuration has the advantage that the voltage drop across the switch remains constant independent of the current flowing through it. Additionally, fault current trip off is automatic and does not depend on auxiliary sense and control circuits.

Each switch configuration has its own special features that afford the means of interrupting the current in a variety of high-voltage switching applications. The switches which use d-c on bias have the advantage that the voltage drop across the switch remains constant independent of the current flowing through them. These switches may be placed in series with the cathode of the TWT to interrupt both the body and collector supplies of the TWT without degrading the quality of the regulated body voltage. The switch may also be used for slow transmitter high-voltage turn on.

It is understood that certain modifications to the invention as described may be made, as might occur to one with skill in the field of the invention, within the scope of the appended claims. Therefore, all embodiments contemplated hereunder which achieve the objects of the present invention have not been shown in complete detail. Other embodiments may be developed without departing from the scope of the appended claims.

What is claimed is:

1. Circuit protection apparatus for arc suppression in a system in which a high-voltage power supply has a storage capacitor connected across a pair of output terminals, with one of the output terminals coupled to a microwave tube for supplying several thousand volts to the tube, with fault current detector means including current sensor means connected in series between the power supply and said tube, for actuating the circuit protection apparatus upon detection of a fault current due to arcing in the microwave tube;

the improvement wherein the circuit protection apparatus comprises switching means including high-speed high-voltage transistor means used as a current interrupter which opens the circuit between said storage capacitor and said tube in response to a signal from said fault current detector means upon detection of a fault current due to arcing in the microwave tube, with means for limiting the current through the switching means;

wherein said switching means comprises a plurality of high-voltage field effect transistors (FETs), each FET having a source, a drain and a gate terminal, the FETs being connected in series, with the drain terminal of each FET except a first one connected to the source terminal of the next, each FET having a resistor connected between its source and drain electrodes, and a resistor connected between its gate and source electrodes;

gate control means comprising transformer means having a plurality of ferrit toroidal cores with primary winding means contained in quartz glass tubing through a plurality of the toroidal cores, and a plurality of secondary windings, each wound on one of the toroidal cores, the secondary windings being coupled to the source and gate terminals of the FETs of said switching means to control the switching means to the On or Off state;

wherein said fault current detector means comprises a threshold detector coupled to the current sensor means, and trigger means having an input coupled to an output of the threshold detector and having outputs coupled to the primary winding means of the gate control means.

2. Circuit protection apparatus according to claim 1, wherein said switching means comprises a plurality of high-voltage transistors in series.

3. Circuit protection apparatus according to claim 1, wherein said current sensor means is a current transformer having a primary winding in series between the power supply and said cathode and a secondary winding coupled to the threshold detector.

4. Circuit protection apparatus according to claim 3, wherein said gate control means includes separate On and Off trigger lines, the On trigger line being one primary winding of said primary winding means threaded through a first set of said toroidal cores, and the Off trigger line being one primary winding of said primary winding means threaded through a second set of said toroidal cores, each FET of the switching means having a first secondary winding on a core of the first set and a second secondary winding on a core of the second set, the ferrite toroidal cores being stacked and separated to provide high-voltage creepage distance.

5. Circuit protection apparatus according to claim 4 wherein there is a diode connected between each secondary winding of the first set and the gate terminal of the FET of the switching means to provide a positive On trigger diode input to the gate terminal that box cars the input capacitance of the FETs of the switching means, whereby the On state may be sustained by applying refresh On triggers.

6. Circuit protection apparatus according to claim 4, wherein there is a zener diode coupled between each secondary winding of the second set and the gate terminal of the FET of the switching means to provide a negative Off trigger transformer circuit to discharge the gate to source capacitance of the series connected FETs of the switching means; whereby the Off state can be maintained by supplying refresh Off triggers.

7. Circuit protection apparatus according to claim 3, wherein said primary winding means comprising a single primary winding, and there is a single secondary winding for each FET of the switching means, wherein the trigger means includes a push pull transistor output circuit which is transformer coupled to said single primary winding, with a zener diode coupled between each secondary winding and the gate terminal of the FET of the switching means, whereby the series connected FETs are driven by a single secondary turn to supply a positive On trigger and a negative Off trigger to the FET gate through the zener diode.

8. Circuit protection apparatus for arc suppression in a system in which a high-voltage power supply has a storage capacitor connected across a pair of output terminals, with one of the output terminals coupled to a microwave tube for supplying several thousand volts to the tube, with fault current detector means including current sensor means connected in series between the power supply and said tube, for actuating the circuit protection apparatus upon detection of a fault current due to arcing in the microwave tube;

the improvement wherein the circuit protection apparatus comprises switching means including high-speed high-voltage transistor means used as a current interrupter which opens the circuit between said storage capacitor and said tube in response to a signal from said fault current detector means upon detection of a fault current due to arcing in the microwave tube, with means for limiting the current through the switching means;

wherein said switching means comprises a plurality of high-voltage field effect transistors (FETs), each FET having a source, a drain and a gate terminal, the FETs being connected in series, with the source terminal of each FET except a first one connected to the source terminal of the next, each FET having a resistor connected between its gate and drain electrodes, and a resistor connected between its gate terminal and the source terminal of the preceeding FET, the FETs being inner laced to provide a boot strap switch which is independent of all auxiliary bias and control circuits for its operation and is a normally on switch;

wherein said fault current detector means is coupled to only the gate and source terminals of said first one of the FETs so that the switching means is automatically latched off when faults occur;

wherein the microwave tube has a cathode to which said power supply is coupled via said switching means, wherein said fault current detector means is a d-c overload sensor circuit which causes the switching means to open when fault currents occur, the current sensor means being a current sense resistor connected between the source electrode of said first one of the FETs and said power supply, said fault current detector means also including an NPN and a PNP bi-polar transistor which causes the switching means to become a constant current source prior to latch up that causes the switching means to open.

9. Circuit protection apparatus according to claim 8, wherein the bi-polar transistors of the fault current detector means each have emitter, base and collector terminals, the junction of the source terminal of said first one of the FETs and the current sense resistor being coupled via a diode to the base terminal of the NPN bi-polar transistor, the power supply end of the current sense resistor being connected directly to the emitter terminal of the NPN bi-polar transistor and via resistor to the collector terminal of the PNP bi-polar transistor, the collector terminal of the NPN bi-polar transistor being connected to the base terminal of the PNP bi-polar transistor, and the emitter terminal of the PNP bi-polar transistor being connected to the gate terminal of said first one of the FETs;

and reset means including a bi-polar transistor coupled to the base and emitter terminals of the NPN bi-polar transistor.

10. Circuit protection apparatus according to claim 9, further including auxiliary input means comprising a connection from an auxiliary input via a diode to the base terminal of the NPN bi-polar transistor, so that the switching means may be operated by auxiliary commands to open the cathode circuit of the microwave tube.

* * * * *

UNITED STATES PATENT AND TRADEMARK OFFICE
CERTIFICATE OF CORRECTION

PATENT NO. : 5,162,965
DATED : November 10, 1992
INVENTOR(S) : Walter E. Milberger et al It is certified that error appears in the above-identified patent and that said Letters Patent is hereby corrected as shown below:

Column 4, line 19, "PREVIOUS METHOD" should be a centered heading.

Column 4, lines 47-48, "substained" should be --sustained--.

Column 4, line 48, a hyphen should follow "follow".

Column 9, line 18, "transformers" should be --transformer's--.

Column 10, line 55, a hyphen should follow "turn".

Column 13, line 15, "ferrit" should be --ferrite--.

Column 14, line 33, "source terminal of the next" should be
      --drain terminal of a preceeding FET--.

Signed and Sealed this

Twenty-sixth Day of October, 1993

Attest:

BRUCE LEHMAN

Attesting Officer      Commissioner of Patents and Trademarks